May 10, 1966 W. RINDNER 3,250,965
CONTROLLABLE REVERSE BREAKDOWN DEVICE
Filed July 31, 1963

INVENTOR
WILHELM RINDNER
BY Donald Brown
AGENT 3,250,965

CONTROLLABLE REVERSE BREAKDOWN DEVICE

Wilhelm Rindner, Lexington, Mass., assignor to Raytheon Company, Lexington, Mass., a corporation of Delaware Filed July 31, 1963, Ser. No. 298,833
2 Claims. (Cl. 317—234)

This invention relates to a semiconductor device and more particularly to a semiconductor device which has a reverse breakdown characteristic controllable by a stress.

The present invention sets forth a new and improved semiconductor device and is predicated on the discovery that nonuniform, concentrated anisotropic stress on junctions of semiconductor devices will provide a controllable reverse breakdown characteristic. This reverse breakdown characteristic varies in accordance with the magnitude of the stress applied to the barrier or junction of the device. By altering the magnitude of the stress, it is possible to select the particular breakdown voltage characteristic desired. Prior art devices having a controlled voltage breakdown characteristic have not been controllable as a function of the stress applied to a barrier or junction of a semiconductor device. For example, the Zener breakdown diodes have characteristics which vary in accordance with the doping of the diode. Accordingly, if a particular breakdown value of voltage is desired, a diode having a particular voltage breakdown characteristic must be selected. Other types of devices for providing a controlled voltage across a load circuit have included glow tube devices, such as a cold cathode gas discharge diode. With this type of device the value of breakdown voltage is determined by the particular tube chosen which voltage must be set forth prior to incorporation of the tube into a circuit.

Both of these prior art voltage breakdown devices have found wide usage as voltage regulators to maintain an approximately constant voltage across a load circuit. In present day circuitry, the Zener diodes have been replacing the glow tube voltage regulator devices in most semiconductor applications, but both of these devices have the inherent disadvantage of not having a mechanically controllable reverse voltage breakdown characteristic.

Accordingly, it is an object of this invention to provide a new and improved controllable reverse voltage breakdown semiconductor device.

It is an additional object of this invention to provide a semiconductor device which exhibits a reverse voltage breakdown characteristic controllable with the magnitude of a stress or force applied to a junction of the device.

In accordance with this invention, a shallow junction semiconductor device having a barrier or junction disposed between semiconductor layers of opposite conductivities is utilized to provide a reverse voltage breakdown characteristic. By applying a stress or a force to a surface of one of said semiconductor layers, thereby producing a stress or force in the barrier or junction region of the device, a controllable voltage breakdown characteristic is obtained which varies in accordance with the magnitude of the force or stress applied.

Other objectives or features of this invention will become apparent from the following description taken in conjunction with the following drawings, wherein.

Figure 1:
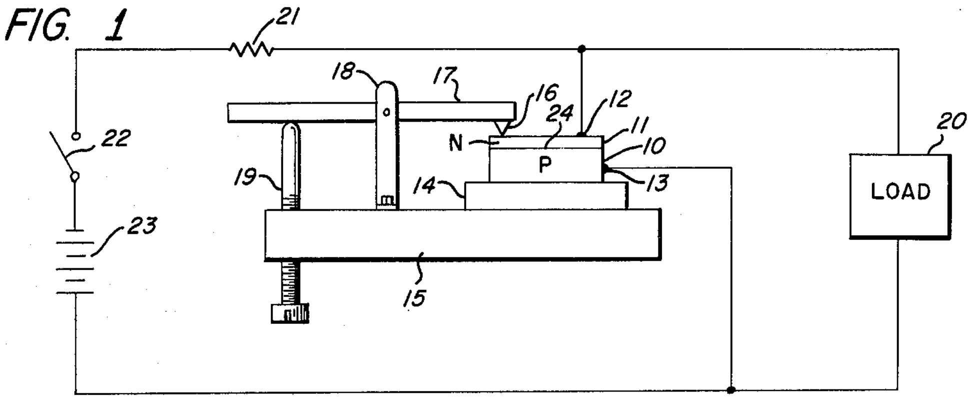
FIG. 1 is a side elevational view of a controllable reverse breakdown device in circuit embodying this invention.

Referring now to FIG. 1, which shows a controllable reverse voltage breakdown device according to the invention, a body of semiconductor material, such s germanium, silicon, or other equivalent having a first P layer 10, is shown having diffused therein a material such as Sb to form a shallow N layer 11. Disposed between the N and P layers is a force or stress sensitive shallow rectifying barrier or junction 24. The semiconductor layered device is shown conventionally mounted on an isolating block 14. The isolating block 14 is positioned and mounted on a base member 15. A pointed device, such as a stylus or phonograph needle 16, is shown rigidly connected to a pivotal arm 17, secured to a bracket 18 mounted on the base 15. A set screw 19 is shown threaded through the base 15 and contacts arm 17 in such a manner that by turning the set screw 19, the stylus or needle 16 will apply a force to a surface of the semiconductor device closest to the junction 24 in order to produce a stress or force in the barrier or junction 24. By varying the setting of the set screw 19, the reverse breakdown voltage characteristic of the device can be altered.

The semiconductor device is shown coupled in circuit with a load 20 by ohmic contacts 12 and 13 to act as a voltage regulator or reference device. Coupled in circuit with this voltage regulator is a series resistance 21 which is coupled through a switch 22 to a voltage source 23. Upon the closing of switch 22 and by properly adjusting set screw 19 to produce a force, such as $F_1$, $F_2$ or $F_3$ shown in FIG. 2, the desired reference voltage or predetermined voltage required by the load device can be mechanically determined in accordance with the magnitude of the force applied by the stylus 16 to the surface of the semiconductor device. Thus, for the germanium semiconductor device of FIG. 1, a controlled voltage breakdown is obtained which exhibits a decrease in the reverse breakdown voltage with an increase in the force or stress applied to the junction or barrier. Therefore, if a particular reference voltage is required by a load, a device such as shown in FIG. 1 mounted in a standard transistor package and having a set screw or other mechanically variable structure can be pre-set to provide a desired voltage breakdown characteristic.

In particular, the preferred embodiment utilizes the diode transducer, details of which are described in my co-pending applications Serial No. 183,940, filed on March 30, 1962 and Serial No. 261,065, filed on February 26, 1963, and which consists of the N and P type layered devices described with relation to FIG. 1. The diode transducer described in my co-pending applications is a particularly sensitive device due to the location of the junction or rectifying barrier region being only slightly below the surface of one of the layers and the selecting of a small portion thereof in which to concentrate a nonuniform, anisotropic stress or force to produce a concentrated, nonuniform, anisotropic strain confined to a small volume of the shallow junction region. It has been found that a point having a small radius of curvature, no greater than 250 microns, provides the best observed effects when the point, such as point 16, is used to press against the top of surface 11, closest to the junction 24.

In addition, my co-pending applications teach a barrier or junction between the layers at points less than 0.010 inch from the surface to which the force is applied should be used in order to obtain sensitive control of the device.

Figure 2:
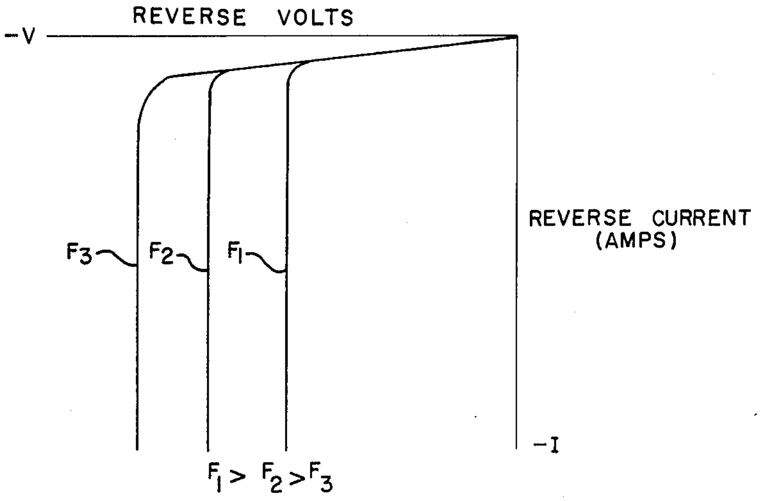
FIG. 2 is a graph of voltage and current of the reverse breakdown device showing a decrease in breakdown voltage with an increase in force or stress applied to the device.
Figure 3:
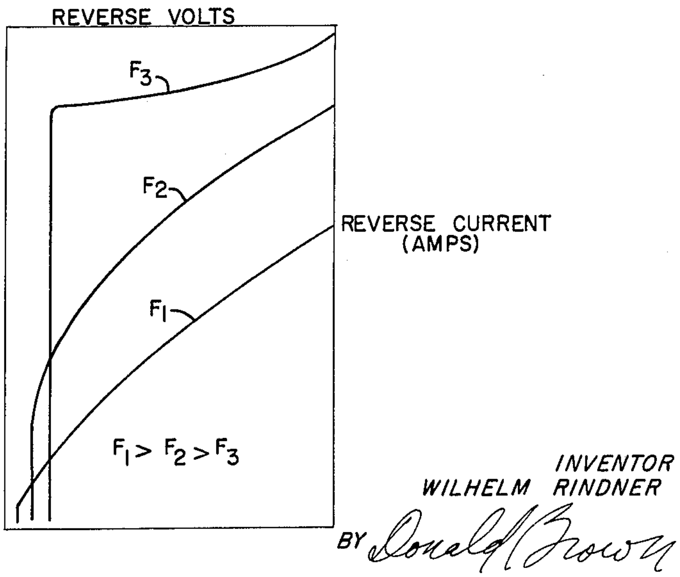
FIG. 3 is a graph of voltage and current characteristics of a P–N junction device showing an increase in breakdown voltage with increase in stress for particular semiconductor materials.

Referring now to FIG. 3, there is disclosed the reverse voltage current characteristics of a silicon device having diffused therein boron about 0.45 micron deep in a 3.5 ohm-centimeter silicon chip. With this particular combination of materials, such as P-type diffused layer and N-type silicon, it is possible to obtain the characteristics as shown in FIG. 3. The distinctive feature of the characteristics of FIG. 3, versus that in FIG. 2, is that with an increase in force an increase in breakdown voltage is obtained. This feature has been observed primarily in silicon junctions under doping conditions as disclosed above.

Although the preferred embodiment has been shown and described with relation to diffused layers, alloyed junction devices may be constructed to provide similar results. Furthermore, stress or force sensitive avalanche diodes, transistors as other multilayer devices may be constructed utilizing the above techniques. Accordingly, it is desired that this invention not be limited except as defined by the appended claims.

What is claimed is:

1. A controlled reverse breakdown device including a body of semiconductor material having a rectifying junction disposed at a depth of less than 0.010 inch from a surface of said body, regions of P and N type conductivity material separated by said junction, means for producing a stress in said junction, said means for producing a stress comprising a stylus member bearing on said surface of said material with a pointed tip having a radius of curvature of less than about 250 microns, adjustment means, means connected with said stylus member for adjusting the pressure of said member upon said surface to control the magnitude of the stress in said junction thereby pre-setting the reverse breakdown characteristics of the device, and circuit means connected to said semiconductor body and including load means and a voltage source, said load means being responsive to voltage from said voltage source and of a value determined by said breakdown characteristics of the semiconductor body as controlled by said adjustment means.

2. A device as set forth in claim 1 wherein said adjustment means comprises a pivotal arm having one end engaging said stylus member, and threaded means engaging the opposite end of the arm for urging the stylus member in a direction toward and away from said surface of the semiconductor body.

References Cited by the Examiner

UNITED STATES PATENTS

| | | | |
|---|---|---|---|
| 2,549,550 | 4/1951 | Wallace | 179—100.41 |
| 3,132,408 | 5/1964 | Pell | 29—25.35 |

JOHN W. HUCKERT, *Primary Examiner.*

M. EDLOW, *Assistant Examiner.*